United States Patent
Chism, II

(10) Patent No.: US 10,921,369 B2
(45) Date of Patent: Feb. 16, 2021

(54) HIGH PRECISION OPTICAL CHARACTERIZATION OF CARRIER TRANSPORT PROPERTIES IN SEMICONDUCTORS

(71) Applicant: William W. Chism, II, Austin, TX (US)

(72) Inventor: William W. Chism, II, Austin, TX (US)

(73) Assignee: XCalipr Corporation

( * ) Notice: Subject to any disclaimer, the term of this patent is extended or adjusted under 35 U.S.C. 154(b) by 468 days.

(21) Appl. No.: 15/855,142

(22) Filed: Dec. 27, 2017

(65) Prior Publication Data

US 2018/0188319 A1 Jul. 5, 2018

Related U.S. Application Data

(60) Provisional application No. 62/498,685, filed on Jan. 5, 2017.

(51) Int. Cl.
*G01R 31/28* (2006.01)
*G01R 31/309* (2006.01)

(52) U.S. Cl.
CPC ....... *G01R 31/309* (2013.01); *G01R 31/2831* (2013.01)

(58) Field of Classification Search
CPC .................................................. G01R 31/2831
See application file for complete search history.

(56) References Cited

U.S. PATENT DOCUMENTS

| 4,854,710 A | 8/1989 | Opsal et al. |
| 5,255,070 A | 10/1993 | Pollak et al. |
| 5,255,071 A | 10/1993 | Pollak et al. |

(Continued)

FOREIGN PATENT DOCUMENTS

WO  WO-2005114712 A1 * 12/2005 ......... H01L 31/1075

OTHER PUBLICATIONS

B.O. Seraphin and N. Bottka, "Field Effect of the Reflectance in Silicon," Phys. Rev. Lett. 15, 104-107 (1965).

(Continued)

*Primary Examiner* — Charlie Y Peng
(74) *Attorney, Agent, or Firm* — The Law Firm of H. Dale Langley, Jr., P.C.

(57) ABSTRACT

A precise optical technique for measuring electronic transport properties in semiconductors is disclosed. Using tightly focused laser beams in a photo-modulated reflectance system, the modulated reflectance signal is measured as a function of the longitudinal (Z) displacement of the sample from focus. The modulated component of the reflected probe beam is a Gaussian beam with its profile determined by the focal parameters and the complex diffusion length. The reflected probe beam is collected and input to the detector, thereby integrating over the radial profile of the beam. This results in a simple analytic expression for the Z dependence of the signal in terms of the complex diffusion length. Best fit values for the diffusion length and recombination lifetime are obtained via a nonlinear regression analysis. The output diffusion lengths and recombination lifetimes and their estimated uncertainties may then be used to evaluate various transport properties and their associated uncertainties.

20 Claims, 4 Drawing Sheets

(56) References Cited

U.S. PATENT DOCUMENTS

| | | | |
|---|---|---|---|
| 5,260,772 | A | 11/1993 | Pollak et al. |
| 5,270,797 | A | 12/1993 | Pollak et al. |
| 6,512,348 | B1 | 1/2003 | Lagowski et al. |
| 6,963,402 | B2* | 11/2005 | Chism, II ............... B82Y 10/00 250/225 |
| 7,362,088 | B1 | 4/2008 | Faifer et al. |
| 7,391,507 | B2 | 6/2008 | Chism |
| 7,414,409 | B1 | 8/2008 | Faifer et al. |
| 8,300,227 | B2 | 10/2012 | Chism |
| 2003/0213964 | A1* | 11/2003 | Flynn ................. H01L 21/0243 257/85 |
| 2010/0315646 | A1* | 12/2010 | Chism, II ............... G01N 21/55 356/445 |

OTHER PUBLICATIONS

R.E. Nahory and J.L. Shay, "Reflectance Modulation by the Surface Field in GaAs," Phys. Rev. Lett. 21, 1569-1571 (1968).
D.E. Aspnes and A. Frova, "Influence of Spatially Dependent Perturbations on Modulated Reflectance and Absorption of Solids," Solid State Comm. 7, 155-159 (1969).
J.L. Shay, "Photoreflectance Line Shape at the Fundamental Edge in Ultrapure GaAs," Phys. Rev. B 2, 803-807 (1970).
D.E. Aspnes, "Linearized Third-Derivative Spectroscopy with Depletion-Barrier Modulation," Phys. Rev. Lett. 28, 913-916 (1972).
D.E. Aspnes and J.E. Rowe, "Resonant Nonlinear Optical Susceptibility: Electroreflectance in the Low Field Limit," Phys. Rev. B 5, 4022-4030 (1972).
D. Weaire et al., "Effect of low-power nonlinear refraction on laser-beam propagation in Insb," Opt. Lett. 4, 331-333 (1979).
J. Opsal et al., "Thermal-wave detection and thin-film thickness measurements with laser beam deflection," Appl. Opt. 22, 3169-3176 (1983).
J. Opsal and A. Rosencwaig, "Thermal and plasma wave depth profiling in silicon," Appl. Phys. Lett. 47, 498-500 (1985).
E. Yablonovitch et al., "Unusually Low Surface-Recombination Velocity on Silicon and Germanium Surfaces," Phys. Rev. Lett. 57, 249-252 (1986).
J. Opsal et al., "Temporal behavior of modulated optical reflectance in silicon," J. Appl. Phys. 61, 240-248 (1987).
N. Bottka et al., "Modulation Spectroscopy as a Tool for Electronic Material Characterization," J. Elec. Mater. 17, 161-170 (1988).
H. Shen et al., "Dependence of the photoreflectance of semi-insulating GaAs on temperature and pump chopping frequency," Appl. Phys. Lett. 52, 2058-2060 (1988).
H. Shen et al., "Electric field distributions in a molecular-beam epitaxy Ga0.83Al0.17As/GaAs structure using photoreflectance," J. Vac. Sci. Technol. B 7, 804-806 (1989).
M. Sheik-Bahae et al., "High-sensitivity, single beam n2 measurements," Optics Lett. 14, 955-957 (1989).
M. Sheik-Bahae et al.,"Sensitive Measurement of Optical Nonlinearities Using a Single Beam," IEEE Journal of Quantum Electronics 26, 760-769 (1990).
H. Shen and F.H. Pollak, "Generalized Franz-Keldysh theory of electromodulation," Phys. Rev. B 42, 7097-7102 (1990).
H. Shen et al., "Photoreflectance study of surface Fermi level in GaAs and GaAlAs," Appl. Phys. Lett. 57, 2118-2120 (1990).
A. Badakhshan et al., "Correlation between the photoreflectance response at E1 and carrier concentration in n- and b-GaAs," J. Appl. Phys. 69, 2525-2531 (1991).
R.E. Wagner and A. Mandelis, "A Generalized Calculation of the Temperature and Drude Photo-Modulated Optical Reflectance Coefficients in Semiconductors," J. Phys. Chem. Solids 52, 1061-1070 (1991).
H. Shen et al., "Dynamics of photoreflectance from undoped GaAs," Appl. Phys. Lett. 59, 321-323 (1991).
A. Badakhshan et al., "Photoreflectance characterization of GaAs as a function of temperature, carrier concentration, and near-surface electric field," J. Vac. Sci. Technol. B 11, 169-174 (1993).

F.H. Pollak, "Modulation Spectroscopy of Semiconductors and Semiconductor Microstructures," in Handbook on Semiconductors, vol. 2, edited by M. Balkanski, pp. 527-635 (North-Holland, Amsterdam, 1994).
D.V. Petrov et al., "Reflection Z-scan technique for measurements of optical properties of surfaces," Appl. Phys. Lett. 65, 1067-1069 (1994).
H. Ma and C.B. de Araujo, "Two-color Z-scan technique with enhanced sensitivity," Appl. Phys. Lett. 66, 1581-1583 (1995).
D.V. Petrov, "Reflection Z-scan technique for the study of nonlinear refraction and absorption of a single interface and thin film," J. Opt. Soc. Am. B 13, 1491-1498 (1996).
W.H. Press et al., "Modeling of Data," in Numerical Recipes in Fortran 77: The Art of Scientific Computing, 2nd ed., pp. 650-700 (Cambridge University Press, New York, 1996).
D.K. Schroder, "Carrier Lifetimes in Silicon," IEEE Trans. Electron Devices 44, 160-170 (1997).
L. Kronik and Y. Shapira, "Surface photovoltage phenomena: theory, experiment, and applications," Surf. Sci. Rep. 37, 1-206 (1999).
A.J. Sabbah and D.M. Riffe, "Measurement of silicon surface recombination velocity using ultrafast pump-probe reflectivity in the near infrared," J. Appl. Phys. 88, 6954-6956 (2000).
D.K. Schroder, "Surface voltage and surface photovoltage: history, theory and applications," Meas. Sci. Technol. 12, R16-R31 (2001).
J.E. Park et al., "Silicon epitaxial layer lifetime characterization," J. Electrochem. Soc. 148, G411-G416 (2001).
D.K. Schroder et al., "Silicon Epitaxial Layer Recombination and Generation Lifetime Characterization," IEEE Trans. Electron Devices 50, 906-912 (2003).
R.K. Ahrenkiel and J. Dashdorj, "Interface recombination velocity measurement by contactless microwave technique," J. Vac. Sci. Technol. B 22, 2063-2067 (2004).
D. Baek et al., "Surface recombination velocity of silicon wafers by photoluminescence," Appl. Phys. Lett. 86, 112110 (2005).
W. Chism et al., "Photo-Reflectance Characterization of USJ Activation in Millisecond Annealing," J. Vac. Sci. Technol. B 28, C1C15-C1C20 (2010).
R. Ulbricht et al., "Carrier dynamics in semiconductors studied with time-resolved terahertz spectroscopy," Rev. Mod. Phys. 83, 543-586 (2011).
W. Chism and J. Cartwright, "Laser Photo-Reflectance Characterization of Resonant Nonlinear Electro-Refraction in Thin Semiconductor Films," Thin Solid Films 520, 6521-6524 (2012).
D.E. Aspnes, "Analysis of modulation spectra of stratified media," J. Opt. Soc. Am. 63, 1380-1390 (1973).
D.E. Aspnes et al., "Modulation spectroscopy at non-normal incidence with emphasis on the vacuum-uv spectral region," J. Appl. Phys. 47, 602-607 (1976).
B.A. Boukamp, "A Nonlinear Least Squares Fit Procedure for Analysis of Immittance Data of Electrochemical Systems," Solid State Ionics 20, 31-44 (1986).
S.P. Manoharan et al., "Computer Program for Nonlinear Least Square Analysis of Impedance and Admittance Data," Bull. Electrochem. 2, 509-513 (1986).
J.R. MacDonald and L.D. Potter, Jr., "A Flexible Procedure for Analyzing Impedance Spectroscopy Results: Description and Illustrations," Solid State Ionics 23, 61-79 (1987).
F.A. McDonald et al., "Measurement of Semiconductor Transport Properties Using Scanned Modulated Reflectance," in Review of Progress in Quantitative Nondestructive Evaluation, vol. 6A, edited by D. O. Thompson and D. E. Chimenti, pp. 1361-1368 (Plenum Press, New York, 1987).
A. Mandelis, "Coupled ac photocurrent and photothermal reflectance response theory of semiconducting p-n functions. I," J. Appl. Phys. 66, 5572-5583 (1989).
J.R. MacDonald, "Comparison and application of two methods for the least squares analysis of immittance data," Solid State Ionics 58, 97-107 (1992).
U. Behn et al., "Relation between photoreflectance excitation and absorption spectra for GaAs and GaN films," J. Appl. Phys. 93, 221-225 (2003).

(56) References Cited

OTHER PUBLICATIONS

ASTM Designation F76-08, "Standard Test Methods for Measuring Resistivity and Hall Coefficient and Determining Hall Mobility in Single-Crystal Semiconductors," published by ASTM International, Aug. 2008.

Z. Hua et al., "The Study of Frequency-Scan Photothermal Reflectance Technique for Thermal Diffusivity Measurement," manuscript prepared for the U.S. Department of Energy, INL/JOU-14-33926, Jan. 2015.

* cited by examiner

HIGH PRECISION OPTICAL CHARACTERIZATION OF CARRIER TRANSPORT PROPERTIES IN SEMICONDUCTORS

CROSS-REFERENCE TO RELATED PATENT APPLICATIONS

The present invention claims priority to U.S. Provisional Patent Application Ser. No. 62/498,685, filed on Jan. 5, 2017, entitled "High Precision Optical Characterization of Carrier Diffusion Length, Carrier Mobility, and Sheet Resistance," which provisional patent application is hereby incorporated herein by reference in its entirety for all purposes.

BACKGROUND

Field of the Invention

The present invention relates to optical measurement of electronic transport properties in semiconductors and, more particularly, to high precision measurement of carrier diffusion lengths, recombination lifetimes, diffusion coefficients, mobilities, and related carrier transport properties using photo-modulated reflectance techniques.

Background of the Invention

Semiconductor device performance depends fundamentally on the transport properties of electronic charge carriers within the semiconductor. In modern device manufacturing, many process steps have the potential to alter or degrade carrier transport properties. Spatial and temporal shifts in process conditions cause variations in carrier transport properties, resulting in device timing variability and loss of manufacturing yield. This systematic type of variability is preferentially addressed through the application of "in-line" process control techniques, which require measurements directly on product wafers as they move through the manufacturing flow (i.e. between processing steps). Thus in-line process control is enabled by the ability to rapidly and non-destructively measure properties indicative of final device performance with micrometer scale spatial resolution.

Carrier transport properties are conventionally measured using four-point probe (4PP) and/or Hall effect techniques. Although these techniques have the requisite measurement capability, they are not suitable for in-line process control due to their destructive and time consuming nature. At present, even the most advanced "micro-4PP" and "micro-Hall" techniques require contact with the sample. Such contact is disfavored in process control applications due to the attendant possibility of particulate contamination.

Optical techniques are ideal for process control of semiconductor manufacturing as they are non-contact, can be performed rapidly, and provide micrometer scale resolution. For example, ellipsometry has been widely adopted in the semiconductor industry for the non-contact measurement of film thicknesses. Furthermore, numerous optical techniques have been developed for measurement of carrier transport properties. Surface photo-voltage (SPV), photo-conductance decay, free carrier absorption, photo-luminescence, and time resolved THz spectroscopy are among the techniques frequently reported in the prior art. However, in each case some particular feature of the technique presents a significant impediment to use for in-line process control. For example, the capacitive probes used in SPV techniques suffer from limited sensitivity (e.g. from stray capacitances) and poor spatial resolution. The spatial resolution of SPV limits its application to "at-line" process monitoring using unpatterned blanket wafers. Another optical technique, THz spectroscopy, is sensitive to carrier mobility but requires a complicated (and expensive) experimental setup. Thus at present there remains an outstanding need to rapidly and non-destructively measure carrier transport properties between processing steps.

The techniques disclosed herein generally utilize photo-modulated reflectance (PMR) techniques to characterize transport properties of electronic charge carriers. PMR techniques have been particularly important in basic research on semiconductors [F. H. Pollak, "Modulation Spectroscopy of Semiconductors and Semiconductor Microstructures," in *Handbook on Semiconductors*, Vol. 2, edited by M. Balkanski, pp. 527-635 (North-Holland, Amsterdam, 1994).]. The conventional PMR setup consists of an intensity modulated pump light beam used to modulate the reflectivity of the sample, a second continuous wave light beam used to probe the reflectance of the sample, an optical system for directing the pump and probe light beams to the sample, and for directing the reflected probe light onto a photodetector, and a signal processor to measure the differential reflectance. In general, the pump beam is used to modulate the free charge density in a semiconductor sample (i.e. via photo-injection), and hence modulate one or more physical quantities (such as, for example, near surface electric fields), thereby inducing a time periodic variation in the reflectivity of the sample. The pump light is typically modulated at a known frequency so that a phase-locked detection circuit may be used to suppress unwanted noise, resulting in the ability to detect reflectance changes at the ppm level. It may be appreciated that the pump beam in a PMR setup is analogous to the pump beam in a SPV or junction photo-voltage (JPV) measurement. The measured PMR signal is the relative change in the reflected probe light intensity as the intensity modulated pump radiation interacts with the sample and consists of a vector characterized by an amplitude and a phase. The normalized amplitude is the induced change in reflectance (AC) divided by the linear reflectance (DC), whereas the phase is the relative lag of the reflectance change with respect to the driving phase. This phase lag is due to the non-instantaneous relaxation dynamics of the charge carriers within the sample.

For probe beam wavelengths that are resonant with semiconductor interband transitions, the PMR signal arises from an electro-modulation effect (i.e. the Franz-Keldysh effect). This provides a means for optical detection of semiconductor bandstructure and internal electric fields through the appearance of sharp, third derivative spectra [D. E. Aspnes, "Linearized Third-Derivative Spectroscopy with Depletion-Barrier Modulation," *Phys. Rev. Lett.* 28, 913-916 (1972); D. E. Aspnes and J. E. Rowe, "Resonant Nonlinear Susceptibility: Electroreflectance in the Low-Field Limit," *Phys. Rev. B* 5, 4022-4030 (1972).]. Moreover, in accord with the Poisson relation, the experimentally measured PMR signal under such conditions is:

$$\Delta R/R = 2qN_e/\Lambda(\lambda)/\varepsilon_s \times \Delta V, \quad (1)$$

where q is the electronic charge, $N_e$ is the active dopant concentration, $\Lambda(\lambda)$ is a line-shape function determined by the semiconductor bandstructure ($\lambda$ is the probe beam wavelength), $\varepsilon_s$ is the static dielectric constant, and $\Delta V$ is the pump induced photo-voltage [N. Bottka et al., "Modulation Spectroscopy as a Tool for Electronic Material Characterization," *J. Electron. Mater.* 17, 161-170 (1988).]. Eq. (1) is valid for depleted surfaces provided the electric field is not too inhomogeneous [D. E. Aspnes and A. Frova, "Influence of Spatially Dependent Perturbations on Modulated Reflectance and Absorption of Solids," *Solid State Comm.* 7, 155-159 (1969). ("Aspnes 1969")].

In conventional PMR analysis, a nonlinear regression analysis is used to adjust the variables within a parameterized third derivative functional form to provide an optimum fit to the PMR signal as a function of wavelength. The nonlinear regression analysis outputs the best-fit parameters, a statistical estimate of the error in the output parameters, and an overall "goodness-of-fit" measure. The error estimates generally depend upon (i) the measurement uncertainties at each data point, (ii) the number and spacing of the data points, and (iii) the match of the analytic model to the data [W. H. Press et al., "Modeling of Data," in *Numerical Recipes in Fortran 77: The Art of Scientific Computing*, 2nd ed., pp. 650-700 (Cambridge University Press, New York, 1996).]. The conventional fit procedure is typically used to determine semiconductor interband transition energies, widths, and/or amplitudes. As noted, the third derivative form is large only nearby strong optical absorptions in the semiconductor band structure, and thus may be used to measure interband transition energies with great precision. Spectroscopic PMR techniques are also useful to measure material composition and/or physical strain in semiconductors since interband transition energies shift under composition and strain. These features account for the historical importance of PMR in basic research on semiconductors.

More recently, PMR techniques using a monochromatic laser probe beam suitable for in-line process control applications have been developed [W. W. Chism, "Method of Photo-Reflectance Characterization of Strain and Active Dopant in Semiconductor Structures," U.S. Pat. No. 7,391,507, issued Jun. 24, 2008.]. For example, provided the probe beam wavelength is suitably chosen, the PMR signal is linearly proportional to the active dopant concentration, which is particularly convenient for control of advanced annealing processes in modern semiconductor manufacturing [W. Chism et al., "Photo-Reflectance Characterization of USJ Activation in Millisecond Annealing," *J. Vac. Sci. Technol. B* 28, C1C15-C1C20 (2010). ("Chism 2010")]. Moreover, since the photo-injected carriers will always reduce the latent voltage, the PMR signal reverses sign under a reversal of the surface polarity. Thus the sign of PMR signal may be used to infer which type of carrier is present. "Z-scan" PMR techniques, wherein the position of the sample surface is scanned through focus while spatial distortion of the reflected probe beam is analyzed via an aperture in the far field, have also been used to distinguish the refractive and absorptive components of the PMR signal [W. W. Chism, "Method and Apparatus of Z-scan Photoreflectance Characterization," U.S. Pat. No. 8,300,227, issued Oct. 30, 2012.]. In certain situations, the coherent wavefront of the laser probe beam may be used to isolate the refractive component of the PMR signal, greatly simplifying the data analysis [W. Chism and J. Cartwright, "Laser Photo-Reflectance Characterization of Resonant Nonlinear Electro-Refraction in Thin Semiconductor Films," *Thin Solid Films* 520, 6521-6524 (2012).].

Despite these advances, PMR is not widely used to determine electronic transport properties in semiconductors. Rather, SPV and other aforementioned optical techniques are more commonly used for non-contact measurement of carrier transport properties. As noted, the pump beam in a PMR setup is analogous to the pump beam in a SPV or JPV measurement. Also, in accord with Eq. (1), the PMR signal is linearly proportional to the SPV ($\Delta V$). The SPV depends on the pump beam and the physics of its interaction with the sample [L. Kronik and Y. Shapira, "Surface photovoltage phenomena: theory, experiment, and applications," *Surf. Sci. Rep.* 37, 1-206 (1999).]. Thus, determination of carrier transport properties from SPV measurements generally requires prior knowledge of the sample physics, e.g. pump absorption depth, surface and/or interface recombination velocities, etc. Moreover, only in certain limiting cases are the desired transport properties directly related to the measured quantities (SPV amplitude and phase). However, the SPV amplitude is generally linear in the pump intensity provided the photo-injection is small with respect to the restoring current [D. K. Schroder, "Carrier Lifetimes in Silicon," *IEEE Trans. Electron Devices* 44, 160-170 (1997); J. E. Park et al., "Silicon epitaxial layer lifetime characterization," *J. Electrochem. Soc.* 148, G411G416 (2001). ("Park 2001")]. In this case the SPV will exhibit the spatial dependence of the excess carrier density. In the one-dimensional (1D) limit, the SPV may be obtained from the solution of the 1D differential equation for the modulated the carrier density [D. K. Schroder, "Surface voltage and surface photovoltage: history, theory and applications," *Meas. Sci. Technol.* 12, R16-R31 (2001).]. In the three-dimensional (3D) limit, the excess carrier density with a Gaussian laser source involves a Gaussian weighted zero-order Hankel transform of the 1D solution and therefore must be treated numerically [J. Opsal et al., "Thermal-wave detection and thin-film thickness measurements with laser beam deflection," *Appl. Opt.* 22, 3169-3176 (1983).]. Thus in view of the appearance of the SPV in the PMR signal, the difficulties encountered in the use of SPV to determine carrier transport properties are likewise present in conventional PMR techniques.

However, as disclosed herein, use of laser beams for both the pump and probe in a PMR setup means the reflected probe beam may be treated directly according to the analytically tractable method of Gaussian decomposition [D. Weaire et al., "Effect of low-power nonlinear refraction on laser-beam propagation in Insb," *Opt. Lett.* 4, 331-333 (1979); M. Sheik-Bahae et al., "High-sensitivity, single beam $n_2$ measurements," *Optics Lett.* 14, 955-957 (1989); M. Sheik-Bahae et al., "Sensitive Measurement of Optical Nonlinearities Using a Single Beam," *IEEE J. Quant. Electron.* 26, 760-769 (1990); D. V. Petrov et al., "Reflection Z-scan technique for measurements of optical properties of surfaces," *Appl. Phys. Lett.* 65, 1067-1069 (1994).]. The numerical treatment required by the prior art in the 3D limit is thereby avoided. Moreover, as demonstrated herein, the analytic expression resulting from treatment by the method of Gaussian decomposition enables a nonlinear regression analysis to directly determine carrier transport properties without prior knowledge of the sample physics.

SUMMARY OF THE INVENTION

The present invention relates to methods for determining electronic transport properties in a semiconductor sample. More particularly, the present invention provides methods for the direct, high precision optical characterization of carrier diffusion lengths, recombination lifetimes, and/or diffusion coefficients using Z-scanning laser photo-modulated reflectance techniques. Once these carrier properties are measured, various additional electronic transport properties including the carrier mobility, the carrier effective mass, and the sheet resistance may the evaluated with high precision. Thus high precision optical characterization of carrier transport properties is achieved.

The methods disclosed herein generally utilize laser beams for both the pump and probe beams in a photo-modulated reflectance apparatus. The pump beam is an intensity modulated laser beam used to modulate the charge density in a semiconductor sample. The pump beam induces a modulated excess carrier density within the sample within a radius of modulation $\omega_m = (\omega_p^2 + L_d^2)^{1/2}$, where $\omega_p$ is the pump beam radius and $L_d$ is the carrier diffusion length. In low injection, the induced photovoltage will exhibit the spatial dependence of the excess carrier density. Thus the spatial profile of the induced photovoltage depends on the carrier diffusion length. A second continuous wave laser beam is used to probe the change in reflectance of the sample as the intensity modulated pump radiation interacts with the sample. PMR signals are acquired as a function of the distance of the sample surface from the focal plane of the pump beam. As the sample is stepped through focus, the area of modulation varies according to the relation $\omega_m^2(Z) = \omega_p^2(Z) + L_d^2$, where Z is the distance from the pump beam waist to the sample surface and $\omega_p(Z)$ is the radius of the incident pump beam at the sample surface (i.e. $\omega_p^2(Z) = \omega_p^2[1+(Z/z_p)^2]$, where $z_p = \pi\omega_p^2/\lambda_p$ is the Rayleigh range of the pump beam and $\lambda_p$ is the pump beam wavelength). The modulated component of the reflected probe beam is also a Gaussian beam with radius defined by the incident probe beam radius and the radius of modulation. The reflected probe beam is collected and input to the detector, thereby integrating over the transverse profile of the reflected probe beam. This spatial integration results in a simple analytic expression for the Z dependence of the PMR signal which depends solely on the focal parameters and the complex carrier diffusion length. The analytic expression enables a nonlinear regression analysis which outputs the carrier diffusion length, diffusion coefficient, and/or recombination lifetime, including error estimates on the output parameters, and a "goodness-of-fit" measure. Thus the numerical treatment required by the prior art is avoided by treating the reflected laser probe beam directly by the method of Gaussian decomposition. Moreover, as the complex diffusion length is the only sample parameter on which the Z profile of the PMR signal depends, the techniques disclosed do not require knowledge or interpretation of the physics underlying the PMR signal at $Z=0$.

A regressive fit to the PMR data is performed using a parameterized function wherein at least one carrier transport property is treated as a variable parameter. The error estimates on the output fit parameters depend upon the measurement uncertainties at each data point, the number and spacing of the data points, and the match of the analytic model to the data. The PMR measurement uncertainties approach the ppm level whereas the analytic model presented herein is broadly applicable. Thus in practice, the technique only depends upon the number and spacing of the data points in Z. In short, the analytic parameterization for the Z dependence of the PMR signal in terms of the complex diffusion length enables the direct, high precision determination of carrier diffusion lengths and/or recombination lifetimes using data obtained from a simple optical arrangement.

Once the diffusion length and recombination lifetime (and their estimated uncertainties) are known from the fit procedure, these carrier transport properties may be used to evaluate the diffusion coefficient, or equivalently, the carrier mobility (via the Einstein relation). Alternatively, low and high frequency PMR amplitude curves can be fit to obtain the carrier diffusion length and diffusion coefficient, respectively (which then may be used to evaluate the recombination lifetime). And once the mobility and the recombination time are known, the carrier effective mass may be evaluated. Similarly, once the mobility is known, it may be used in combination with the active dopant concentration in order to determine the sheet resistance (or equivalently, the sheet conductance). Thus the present disclosure describes the of Z-scanning laser PMR techniques to rapidly, nondestructively and precisely characterize electronic transport properties including carrier diffusion lengths, recombination lifetimes, diffusion coefficients, mobilities, effective masses, and sheet resistances.

Furthermore, the Z-scanning laser PMR techniques disclosed here are fully applicable to PMR techniques which directly detect the excess carrier density (i.e. via the Drude effect). The experimentally measured PMR signal under such conditions is:

$$\Delta R/R = -q^2\lambda^2/2\pi^2\varepsilon_s n(n^2-1)mc^2 \times \Delta N, \qquad (2)$$

where n is index of refraction, m is the carrier effective mass, and $\Delta N$ is the pump induced excess carrier density [R. E. Wagner and A. Mandelis, "A Generalized Calculation of the Temperature and Drude Photo-Modulated Optical Reflectance Coefficients in Semiconductors," *J. Phys. Chem. Solids* 52, 1061-1070 (1991).]. This Drude effect PMR signal is proportional to the square of the probe wavelength. Thus direct measurement of carrier modulation is preferred at longer wavelengths, such as, for example, in the near-IR. Such wavelengths generally penetrate far more deeply into the bulk and therefore do not provide the near surface specificity available when the wavelength of the probe is selected to coincide with interband transitions in the UV (i.e. such that the PMR signal arises from the Franz-Keldysh effect). Nevertheless, the $\Delta N$ factor present in the expression for the Drude effect PMR signal will exhibit the same spatial profile dependence on diffusion length as exhibited by the photo-voltage. In particular, the pump will induce an excess carrier density within the same radius of modulation as exhibited by $\Delta V$. Thus the inventive techniques disclosed herein are fully applicable to PMR probe beam wavelengths selected to detect the excess carrier density via the Drude effect.

There has thus been outlined, rather broadly, the more important features of the invention in order that the detailed description thereof may be better understood, and in order that the present contribution to the art may be better appreciated. There are additional features of the invention that will be described hereinafter.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

BRIEF DESCRIPTION OF THE DRAWINGS

The following drawings form part of the present specification and are included to further demonstrate certain aspects of the present disclosure. The disclosure may be better understood by reference to one or more of these drawings in combination with the detailed description of specific embodiments presented herein.

DETAILED DESCRIPTION

The following discusses use of the method of Z-scanning laser photo-modulated reflectance characterization of electronic transport properties in semiconductors. It is understood that the method of the present description may be used to determine electronic transport properties in any semiconductor, the discussion of exemplary silicon semiconductors considered to be exemplary only and in no way limiting in scope. It should be appreciated that the present invention provides numerous applicable inventive concepts that may be embodied in a variety of specific contexts. The specific embodiments discussed herein are merely illustrative of specific ways to make and/or use the invention and are not intended to delimit the scope of the invention.

Figure 1:
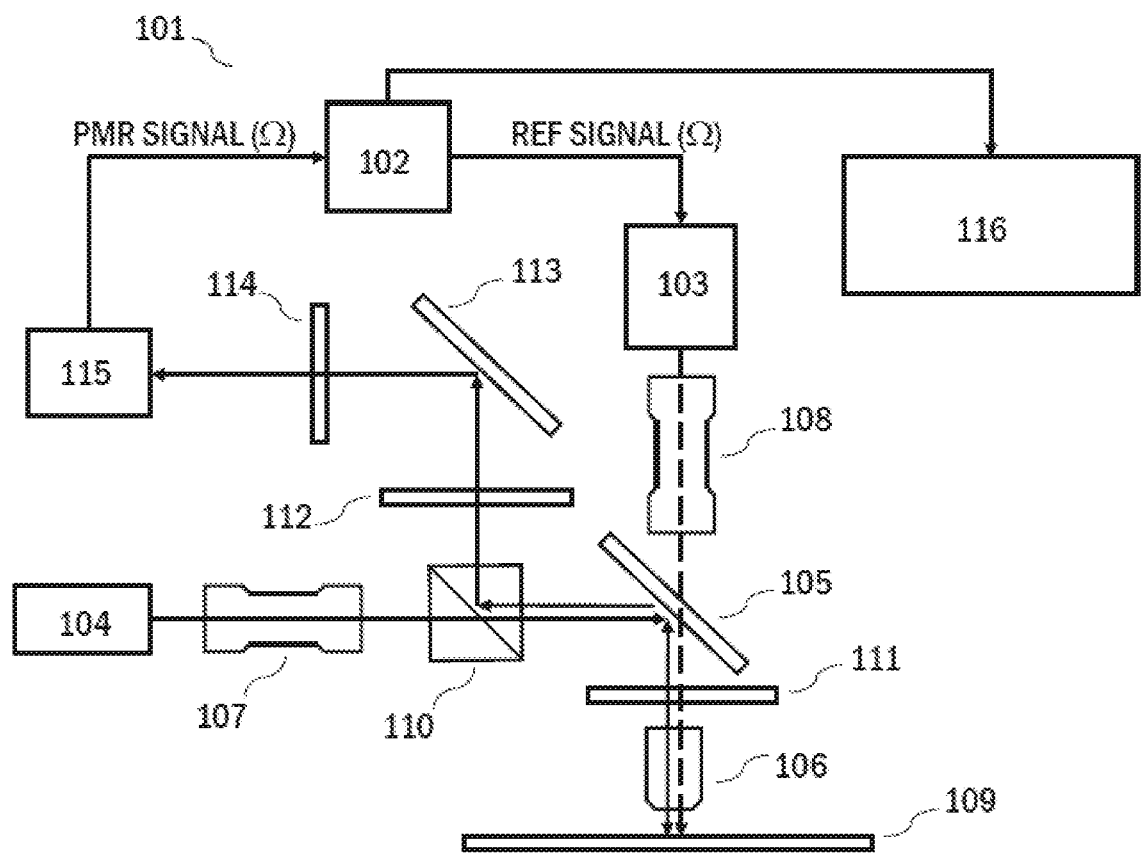
FIG. 1 shows an exemplary schematic laser PMR arrangement that may be used to perform Z-scanning laser PMR measurements in accordance with the present invention.

The present invention is based upon profiling of the output signals of a laser PMR system as the sample is stepped through focus. The specific embodiments discussed here use laser beams having a cylindrically symmetric Gaussian intensity distribution for both the pump and probe beams in a PMR apparatus. However, it should be appreciated the technique of the present disclosure may be accomplished with elliptical Gaussian profile beams or with any other beam profile which admits an analytic parameterization for the Z dependence of the PMR signal in terms of an electronic transport property of the sample. Likewise, it should be appreciated the technique of the present disclosure may be accomplished using a variety of focal geometries, including, for example, focusing the pump beam onto the sample at normal incidence while independently focusing the probe beam onto the sample with an oblique angle of incidence. As shown in FIG. 1, a schematic arrangement 101 that may be used to perform Z-scanning laser PMR measurements in accordance with the present invention comprises a lock-in amplifier 102, a pump laser 103, a probe laser 104, an optical system, which may comprise a dichroic beamsplitter 105, a microscope objective 106, a probe telescope 107, a pump telescope 108, a reflecting semiconductor sample 109, a polarization beamsplitter 110, a quarter wave plate 111, a color filter 112, a dielectric mirror 113, a collection lens 114, a photoreceiver 115, and a computer (or other controller) 116.

In an exemplary embodiment of the present invention, the pump laser 103 intensity is directly modulated via reference signal from the lock-in amplifier 102. The pump amplitude signal may also be modulated by an external function generator, or by some other external means such as a chopper wheel fixtured in the pump beam path, with a reference signal supplied to the lock-in amplifier. The pump and probe beams (from the pump laser 103 and probe laser 104, respectively) are made collinear through the use of the dichroic beamsplitter 105 and co-focused to a point along the beam path using a microscope objective lens 106. The focal positions of the pump and probe beams are controlled with independent telescoping lens arrangements (107 and 108) in either input beam path, which may be automated. The collinear and co-focused pump and probe beams are directed to the semiconductor sample 109 using the microscope objective 106. The microscope objective 106 is mounted on a stage effective to translate the microscope objective along the common beam path. The stage, which may be motorized and/or controlled by the computer/controller 116, provides for control of the displacement of the microscope objective 106 from the sample 109. As the pump radiation interacts with the sample, the sample obtains a reflectance modulation, which results changes in amplitude of the reflected probe light. The semiconductor sample 109 reflects the incident probe beam back through the microscope objective 106. The polarization beamsplitter 110, operating in conjunction with a quarter wave plate 111, is used to switch the reflected probe beam out of the incoming probe beam path. The intensity of the pump and probe beams at focus may also be controlled via neutral density filters fixtured in either input beam path. In order to remove any residual pump light and/or any photo-luminescence signal, the reflected probe beam is projected through a color filter 112 and/or onto a dielectric mirror 113. (Likewise, it may be appreciated any attendant photo-luminescence signal may be separated through the use of suitable dielectric mirrors and/or color filters and analyzed in accord with techniques known in the art.) The reflected probe beam is collected at the collection lens 114 and input to the photoreceiver 115, thereby integrating over the radial profile of the beam. The resulting Z dependence of the modulated reflectance depends solely on the focal parameters and the complex carrier diffusion length. The photoreceiver output signal (voltage or current) is passed to the lock-in amplifier 102, which measures the PMR signal. The PMR signal is the relative change in the radially integrated reflected probe light intensity and consists of a vector characterized by an amplitude and a phase. The microscope objective 106 is stepped through sequence of positions with respect to the sample surface. At each position, the PMR signal is measured and transmitted to the computer/controller 116, which records the PMR signal as function of Z. The computer 116 may also be used to perform a nonlinear regression analysis to determine an electronic transport property of the sample as described hereinafter.

Figure 2:
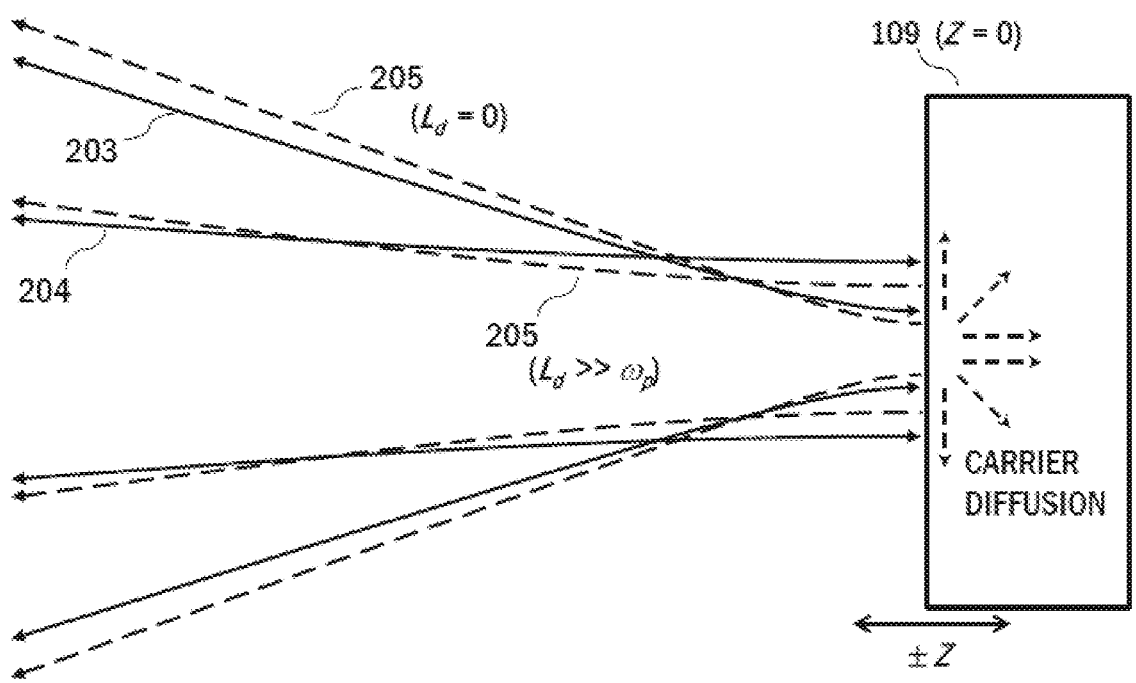
FIG. 2 shows an exemplary focal geometry of the pump and probe (both incident and reflected) beams at Z=0. Exemplary profiles of the reflected AC probe beam for different values of $L_d$ are also shown.

In an exemplary embodiment, the pump and probe beams are directed at normal incidence onto a sample. The distance between the common beam waist and the sample surface is Z. The focal geometry of the incident pump and probe beams at Z=0 is illustrated in FIG. 2. At focus, the linear reflected pump and probe beam profiles (203 and 204, respectively) will coincide with their respective input beams. As noted, the pump will induce a reflectance modulation within a radius $\omega_m = (\omega_p^2 + L_d^2)^{1/2}$. As the pump beam is stepped through focus, the area of modulation varies according to the relation $\omega_m^2(Z) = \omega_p^2(Z) + L_d^2$. The Fresnel coefficient for the reflected probe beam includes the changes due to pump-induced energy transformation processes. The mirror-reflected probe beam amplitude may be expanded as a sum of Gaussian beams of decreasing waist. In particular, given a dominant photovoltage effect according to Eq. (1), and retaining only two terms in the expansion, the electric field of the reflected probe laser beam at the surface of the sample may be written (disregarding the common spatial phase):

$$E_r = E_o \omega_o/\omega(Z) \times \exp\{-\rho^2/\omega^2(Z)\} \times [r + \partial r/\partial n \times (n_2 + ik_2) I_p \omega_m^2/\omega_m^2(Z) \times \exp\{-2\rho^2/\omega_m^2(Z)\}], \quad (3)$$

where $|E_o|^2$ is the intensity of the probe beam at focus, $\omega_o$ is the probe beam waist (i.e. $\omega(Z) = \omega_o[1+(Z/z_o)^2]^{1/2}$, where $z_o = \pi \omega^2/\lambda$ is the Raleigh range of the probe beam), $\rho$ is the radial distance as measured from the probe beam axis, r is the complex reflectance coefficient, n is the index of refraction of the sample, $n_2$ and $k_2$ are effective nonlinear indices defined by the coefficients appearing in Eq. (1), $I_p$ is the intensity of the pump beam at focus, and $\omega_m(Z)$ is the radius of modulation as previously defined. The leading term corresponds to the DC component of the reflected probe beam whereas the second term corresponds to its modulated component. The broadening of the pump source by carrier diffusion is explicit in the factors $\omega_m$ and $\omega_m(Z)$ appearing in the second term. The modulated component of the reflected probe beam is also a Gaussian beam with radius defined by the incident probe beam radius and the radius of modulation. At each value of Z the reflected AC probe beam component retains a Gaussian form with a smaller effective waist. FIG. 2 also shows the reflected AC probe beam profile 205 for different values of $L_d$. When $L_d \cong 0$, the waist of AC reflected probe beam is smaller than that of either the pump or the probe beam. However, when $L_d^2 \gg \omega_p^2$ the AC reflected beam 205 will approach the reflected DC profile. Thus the profile of the AC reflected probe beam is dependent upon the diffusion length. In the case of a dominant Drude effect, the expression for the mirror-reflected probe beam field at the surface is of precisely the same form as Eq. (3), the only distinction being that the effective nonlinear indices $n_2$ and $k_2$ are now defined by the coefficients appearing in Eq. (2).

Squaring the mirror-reflected probe field and integrating the over the beam profile yields the spatially integrated PMR signal via the identity:

$$1 + \Delta R/R = [\int_0^\infty |E_r|^2 \rho d\rho] / [\int_0^\infty |E_{dc}|^2 \rho d\rho], \quad (4)$$

where $E_{dc}$ is just the linear reflectance amplitude. Neglecting terms of second order in the nonlinear indices and performing the spatial integrations in Eq. (4), the PMR signal may be written:

$$\Delta R/R = 4n_2 I_p/(n^2 - 1) \times (\omega_p^2 + L_d^2)/(\omega^2(Z) + \omega_p^2(Z) + L_d^2), \quad (5)$$

where $n^2 \gg k^2$. The key observation here is that the Z dependence of the PMR signal is contained entirely within the denominator of Eq. (5). Moreover, if $\omega_o^2 + \omega_p^2 \le L_d^2$, the 3D limit will be approached for Z=0 [J. Opsal et al., "Temporal behavior of modulated optical reflectance in silicon," *J. Appl. Phys.* 61, 240-248 (1987).]. However, well away from Z=0 (i.e. where $\omega^2(Z) + \omega_p^2(Z) \le L_d^2$), the 1D limit is restored. (Note Eq. (3) is valid in the 3D limit. Thus the treatment by the method of Gaussian decomposition smoothly interpolates between the 3D and 1D limits.) Accordingly, the appearance of $L_d^2$ in the denominator of Eq. (5) shows the Z dependence of the PMR signal will depend strongly on diffusion length provided the pump and probe beam waists are commensurate with $L_d$.

Furthermore, at "intermediate" modulation frequencies where the recombination lifetime is comparable to the modulation period (i.e. $\Omega \tau \sim 1$, where $\Omega$ is the modulation frequency in radians per second and $\tau$ is the recombination lifetime), $\tau$ likewise becomes coupled into the Z dependence of the PMR signal through the appearance of the complex diffusion length $L_d \to L_d/(1+i\Omega\tau)^{1/2}$. In particular, Eq. (5) demonstrates that the PMR signal as a function of Z may be parameterized by the expression:

$$\Delta R/R = A \exp\{i\phi_o\}/[\omega^2(Z) + \omega_p^2(Z) + L_d^2/(1+i\Omega\tau)], \quad (6)$$

where A and $\phi_o$ are the Z independent PMR amplitude and phase, respectively. Remarkably, the dependencies of the PMR signal on various parameters such as pump absorption depth and surface or interface recombination velocities are absorbed into A and $\phi_o$. Thus the Z dependence of the PMR signal is independent of the various parameters which determine the PMR amplitude and phase at Z=0. Thus the methods disclosed here do not require prior knowledge of such parameters or how they enter into the PMR signal.

The coupling of the complex diffusion length into the Z dependence of the PMR signal indicates that $L_d$, and ultimately $\tau$, may be determined by a regressive fit to the experimental Z-scan PMR data. For example, according to Eq. (6), the Z dependence of the PMR amplitude may be parameterized by the expression:

$$|\Delta R/R| = A/[L_d^4 + 2L_d^2\{\omega^2(Z) + \omega_p^2(Z)\} + \{\omega^2(Z) + \omega_p^2(Z)\}^2(1+\Omega^2\tau^2)]^{1/2}, \quad (7)$$

whereas the Z dependence of the PMR phase may be parameterized by the expression:

$$\phi = \phi_o + \tan^{-1}\{L_d^2 \Omega \tau/[L_d^2 + \{\omega^2(Z) + \omega_p^2(Z)\}(1+\Omega^2\tau^2)]\}. \quad (8)$$

Thus the Z dependence of the PMR amplitude may be parameterized by the set of variables: A, $L_d^2$, $\omega_p^2$, $\omega_o^2$, and $\Omega\tau$, whereas the corresponding phase expression allows analytic parametrization using the variables: $\phi_o$, $L_d^2$, $\omega_p^2$, $\omega_o^2$, and $\Omega\tau$. (Note that $\Omega$, $\omega_o$, and $\omega_p$ are system parameters, whereas A, $\phi_o$, $L_d^2$, and $\tau$ are sample parameters. For analysis purposes, the system parameters may be treated as fixed parameters, whereas the sample parameters may be treated as variable parameters to be resolved by the fit procedure.) A nonlinear regression analysis can then be used to adjust the variables within the appropriate parameterized expression to provide an optimum fit to the PMR phase and/or amplitude data. For example, as disclosed in U.S. Provisional Patent Application Ser. No. 62/498,685 (incorporated herein by reference), the well-known Levenberg-Marquardt method may be used to adjust the variables within a nonlinear equation of the form of Eq. (7) in order to establish the carrier diffusion length and its estimated uncertainty. (Note that in the limit $\Omega\tau \approx 0$, Eq. (7) reduces to $|\Delta R/R| \approx A/[L_d^2 + \omega^2(Z) + \omega_p^2(Z)]$.)

It is to be appreciated the fit procedure is performed by a computer program, embodied on a non-transitory computer readable medium (including any medium that facilitates transfer of a computer program from one location to another), comprising executable code effective to receive PMR amplitude and/or phase data acquired as a function of Z, system parameters (such as modulation frequency, focal parameters, etc.), and initial guesses for variable parameters, to perform the nonlinear regression analysis, and to output the best-fit parameters, a statistical estimate of the error in the output parameters, and an overall "goodness-of-fit" measure, as necessary. Thus computer program residing on a physically separated computer, a remote server, or the like, may be used to perform the nonlinear regression analysis in accord with the present invention, such use falling within the scope of the disclosure.

At intermediate frequencies, we have a pair of nonlinear equations, containing a number of common variables, from which we attempt to extract two variables (i.e. $L_d$ and $\tau$). The parameters A, $L_d^2$, and $\Omega\tau$ are generally correlated within the amplitude fit while the parameters $\phi_o$, $L_d^2$, and $\Omega\tau$ are generally correlated in the phase fit. However, the expression for the amplitude has strong dependence upon $L_d$, but only minimal dependence upon $\Omega\tau$. On the other hand, the expression for the phase is strongly dependent upon $\Omega\tau$ (i.e. via the argument of the arctangent appearing in Eq. (8)). Accordingly, the decomposition of Eq. (6) into simultaneous equations for amplitude and phase allows an iterative fit procedure (with the estimated uncertainties output from a standard nonlinear least-squares minimization procedure).

First, in order to provide an initial estimate of $L_d^2$, a conventional nonlinear least-squares procedure may be used to adjust the parameters of Eq. (7), while holding $\Omega\tau$ constant (~1), to provide an optimized fit to the Z-scanning PMR amplitude data. An exemplary FORTRAN subroutine which may be used to adjust the parameters of Eq. (7) while holding $\Omega\tau$ constant is as follows:

```
SUBROUTINE funcs(x,a,y,dyda,na)
INTEGER na
REAL x,y,a(na),dyda(na)
REAL PI, WT, LPU, LPR, DPU, DPR, WBD2, DENOM
PI=4.0*ATAN(1.0)
WT=0.87338
LPU=.488
LPR=.375
DPU=x-a(5)
DPR=x-a(6)
WBD2=a(2)*(1.0+(LPU*DPU/PI/a(2))**2)
WBD2=a(4)*(1.0+(LPR*DPR/PI/a(4))**2)+WBD2
DENOM=WBD2**2*(1.0+WT**2)
DENOM=a(3)**2+2.*a(3)*WBD2+DENOM
y=a(1)/SQRT(DENOM)+a(7)
dyda(1)=1./SQRT(DENOM)
dyda(3)=-a(1)/DENOM**1.5*(a(3)+WBD2)
dyda(2)=-a(1)/DENOM**1.5*(a(3)+WBD2*(1.+WT**2))
dyda(4)=dyda(2)*(1.0-(LPR*DPR/PI/a(4))**2)
dyda(2)=dyda(2)*(1.0-(LPU*DPU/PI/a(2))**2)
dyda(5)=2.*a(1)/DENOM**1.5*(a(3)+WBD2*(1.+WT**2))
dyda(6)=dyda(5)*DPR/a(4)*(LPR/PI)**2
dyda(5)=dyda(5)*DPU/a(2)*(LPU/PI)**2
dyda(7)=1.0
return
END
``` where x=Z, y=|ΔR/R|, a(1)=A, a(2)=$\omega_p^2$, a(3)=$L_d^2$, a(4)=$\omega_o^2$, a(5) and a(6) are the positions of pump and probe beam waists, respectively, and a(7) is a constant offset. Note here $\Omega\tau$ ("WT") is held explicitly constant. However, it should be appreciated a nonlinear equation of the form of Eq. (7) may include $\Omega\tau$ as a variable fit parameter.

Next, holding $L_d^2$ constant at its value as output from the amplitude fit, a conventional nonlinear least-squares procedure may be used to adjust the parameters of Eq. (8) to provide an optimized fit to the Z-scanning PMR phase data. Then the output value for $\Omega\tau$ may be held constant in the amplitude fit in order to improve the estimate of $L_d^2$. This procedure can be iterated, holding each $L_d^2$ output from the amplitude fit constant in the subsequent phase fit, and each $\Omega\tau$ as output from the phase fit constant in the subsequent amplitude fit, until $L_d^2$ and $\Omega\tau$ approach limiting values. The amplitude and phase fits may also be used to provide estimated statistical uncertainties in $L_d^2$ and $\Omega\tau$, respectively. The PMR measurement uncertainties approach the ppm level whereas Eqs. (7) and (8) are broadly applicable. Therefore, in practice, the estimated uncertainties of the output fit parameters depend primarily upon the number and spacing of the data points in Z. Thus the polar form provides an advantageous means to determine $L_d$ and $\tau$ with high precision.

In order to demonstrate the Z-scanning laser PMR technique, a set of silicon samples with various p-type shallow junction structures were evaluated. These samples were selected primarily because they were processed using process conditions encountered in advanced silicon device manufacturing. The large number of samples, all exhibiting large PMR signals, were also convenient to demonstrate the technique and its practicality. The shallow junctions were formed in silicon (100) substrates by implantation of n-type dopant (As) followed by low-energy high-dose B implantation. Dopant activation was performed using millisecond timescale flash-lamp based annealing. A range of base temperature and flash temperature targets were used to study dopant activation, dopant diffusion, and material quality. The process conditions studied included: (i) flash target temperatures in the 1250-1350° C. range, (ii) an additional thermal annealing of the As counter doped layer prior to B implantation, and (iii) use of a Ge amorphizing implant (AI) to reduce B ion channeling. The AI process introduces a layer of crystalline defects close to the sample surface. These defects reduce the carrier diffusion length and recombination time in the implanted region. SIMS data indicated post-activation B doping levels of $\approx 1\times 10^{19}$/cc at junction depths $X_j$=20 nm across the sample set. The voltages across the ultra shallow junctions are relatively large, on the order of several volts, and may be estimated from the conventional 1D Poisson analysis (which also provides the electric fields). A sketch of the pump-on/pump-off carrier flows in the normal direction is shown in FIG. 1 of Chism 2010. While these carrier flows dramatically affect the values A and $\phi_o$, it is to be emphasized the determination of electronic transport properties from Z-scan PMR profiles as disclosed here does not require prior knowledge of A or $\phi_o$.

The Z-scanning laser PMR measurement system was configured with pump and probe beams generated from the output of semiconductor diode lasers. The pump beam generally comprises a laser output with at least one photon energy greater than the smallest interband transition energy of a semiconductor material within the sample. Generally, the probe beam may comprise a laser output with at least one photon energy effective to directly detect the modulated photovoltage induced by the pump, or may comprise a laser output with a least one photon energy effective to directly detect the excess carrier density generated by the pump. The pump and probe beam wavelengths were 488 and 375 nm, respectively. This probe beam wavelength is near the lowest energy direct interband transition in Si, resulting in a dominant photovoltage effect. The 375 nm probe light has an absorption depth in Si $\delta\approx 23$ nm. Therefore, in this embodiment, any detected photo-voltage necessarily occurs at or near the surface (see e.g., Eq. (7) of Aspnes 1969). The pump and probe beams were made collinear by use of a dichroic beamsplitter and were co-focused to a micrometer scale spot on the surface of each sample. As noted, the pump and probe beam waists are selected to be commensurate with the diffusion lengths to be measured. However, as may be appreciated, carrier diffusion lengths vary widely depending on semiconductor materials, crystallinity, dopant concentrations, and surface conditions. For example, the diffusion length of carriers in crystalline Si varies from ~$10^{-1}$ cm to ~$10^{-5}$ cm as the doping density varies from ~$10^{15}$/cc to ~$10^{20}$/cc. In situations where the diffusion length is large the modulation frequency may be selected such that $\Omega\tau\geq 1$, which provides a means to maintain the diffusion length commensurate with the pump and probe beam waists.

The pump laser output was directly modulated via a reference signal from the lock-in amplifier. In general, the phase in a modulated photovoltage measurement will exhibit an arctangent dependence approaching zero for $\Omega\tau \le 1$, and $-\pi/4$ for $\Omega\tau \ge 1$. Therefore, in the "intermediate" regime ($\Omega\tau \sim 1$), the phase will transition, almost linearly, from $\approx 0°$ to $\approx -90°$ (see e.g., FIGS. 8, 13, 16 and/or 17 of Park 2001). For each of the wafers used in this study, this linearity was confirmed over the frequency range 600-900 kHz (see e.g., FIGS. 8-11 of U.S. Provisional Patent Application Ser. No. 62/498,685). Thus an optimal modulation period of 750 kHz was selected.

In general, the modulation frequency is dictated by the carrier recombination lifetime and the transport property to be measured. For example, the diffusion length may be accessed directly by setting the modulation frequency such that $\Omega\tau \approx 0$ (i.e. low frequency), such that the amplitude reduces to $|\Delta R/R| \approx A/[L_d^2 + \omega^2(Z) + \omega_p^2(Z)]$. Then we have one nonlinear equation, containing a number of known system parameters, from which we may evaluate $L_d$. Similarly, the diffusion coefficient D may be accessed directly by setting the modulation frequency such that $\Omega\tau \gg 1$, such that the recombination time is eliminated (i.e. for $\Omega\tau \gg 1$, the amplitude reduces to $|\Delta R/R| \approx A/[(D/\Omega)^2 + \{\omega^2(Z) + \omega_p^2(Z)\}^2]^{1/2}$). Thus, at high frequencies, the amplitude equation may be used to evaluate D, or equivalently, the mobility (via the Einstein relation $\mu = qD/k_BT$, where $k_BT$ is the thermal voltage ($\approx 26$ meV)). The combination of high and low frequency Z-scan PMR data may also be used to determine the recombination time via the relation $\tau = L_d^2/D$, where $L_d$ and D are determined from low and high frequency analyses, respectively. Furthermore, in practice, the recombination lifetime may be accessed directly by setting the modulation frequency such that $\Omega\tau \sim 1$ (i.e. intermediate frequency), such that Eq. (8) may be used in a nonlinear regression analysis in order to evaluate $\tau$. An example FORTRAN subroutine which may be used in nonlinear least-squares minimization of Eq. (8) is as follows:

```
SUBROUTINE funcs(x,a,y,dyda,na)
INTEGER na
REAL x,y,a(na),dyda(na)
REAL PI, LPU, DPU, LPR, DPR, WBD2, DENOM
PI=4.0*ATAN(1.0)
LPU=.488
LPR=.375
DPU=x-a(5)
DPR=x-a(6)
WBD2=a(2)*(1.0+(LPU*DPU/PI/a(2))**2)
WBD2=a(4)*(1.0+(LPR*DPR/PI/a(4))**2)+WBD2
DENOM=a(3)+WBD2*(1.0+a(7)**2)
y=ATAN(a(3)*a(7)/DENOM)+a(1)
dyda(1)=1.
dyda(3)=a(7)/(DENOM**2+(a(3)*a(7))**2)*WBD2*(1.0+a(7)**2)
dyda(2)=-a(3)*a(7)/(DENOM**2+(a(3)*a(7))**2)*(1.0+a(7)**2)
dyda(4)=dyda(2)*(1.0-(LPR*DPR/a(4))**2)
dyda(2)=dyda(2)*(1.0-(LPU*DPU/PI/a(2))**2)
dyda(5)=2.*a(3)*a(7)
dyda(5)=dyda(5)/(DENOM**2+(a(3)*a(7))**2)*(1.0+a(7)**2)
dyda(6)=dyda(5)*DPR/a(4)*(LPR/PI)**2
dyda(5)=dyda(5)*DPU/a(2)*(LPU/PI)**2
dyda(7)=a(3)/(DENOM**2+(a(3)*a(7))**2)
dyda(7)=dyda(7)*(a(3)+WBD2*(1.0-a(7)**2))
return
END
``` where $x \equiv Z$, $y \equiv \phi$, $a(1) \equiv \phi_o$, $a(2) \equiv \omega_p^2$, $a(3) \equiv L_d^2$, $a(4) \equiv \omega_o^2$, $a(5)$ and $a(6)$ are the positions of pump and probe beam waists, respectively, and $a(7) \equiv \Omega\tau$.

As may be appreciated, carrier recombination lifetimes vary widely depending on semiconductor materials, crystallinity, dopant concentrations, and surface conditions. For example, the recombination lifetime of carriers in crystalline Si varies from $\sim 2 \times 10^{-4}$ s to $\sim 10^{-9}$ s as the doping density varies from $\sim 10^{15}$/cc to $\sim 10^{20}$/cc. Maintaining the criteria $\Omega\tau \sim 1$ over such a range of recombination lifetimes requires modulation frequencies ranging from $\sim 1$ kHz to $\sim 160$ MHz. These frequency ranges are accessible with wide bandwidth lock-in amplifiers such as the Signal Recovery model 7280 (operable from ½ Hz to 2 MHz), or the Stanford Research models SR860 (operable from 1 mHz to 500 kHz), SR865A (operable from 1 mHz to 4 MHz), and SR844 (operable from 25 kHz to 200 MHz). As can be appreciated, such wide bandwidth lock-in amplifiers may provide access to the low and high frequency ranges as well.

The pump and probe beam waists were overlapped via telescoping arrangements configured in the input arms of either beam. The entire reflected probe beam was collected and directed into a photoreceiver, thus radially integrating the beam. The photoreceiver was a high speed UV enhanced silicon photo-diode connected to a trans-impedance amplifier circuit. As may be appreciated, it is advantageous to keep the probe intensity at a minimum, since any photo-injection of electron-hole pairs from the probe will necessarily offset the sample baseline condition (e.g. by reducing the latent field). Likewise, any CW component of the pump is undesirable. Excessive pump and probe beam intensities may be avoided via neutral density filters fixtured in the input arms of either beam. For the exemplary samples used here the photo-injected carrier density was maintained in low-injection ($\Delta N/N_e \ll 1$). However, if the probe intensity is too low, detection may not be possible with conventional photodiodes. Thus photoreceiver embodiments include an avalanche photo-diode (APD) connected to an amplifier circuit such as, for example, the Hamamatsu model C12703 high-gain APD module configured with the Hamamatsu model S5344 short wavelength APD. Photoreceiver embodiments may also include a photomultiplier tube connected to an amplifier circuit. The photoreceiver output was passed to the lock-in amplifier, which measured the amplitude and phase of the reflectivity change. This information was transmitted to the computer/controller, which records the components of the differential change in reflectivity vector as a function of Z. Thus Z-scanning PMR data was acquired on the exemplary samples.

Figure 3:
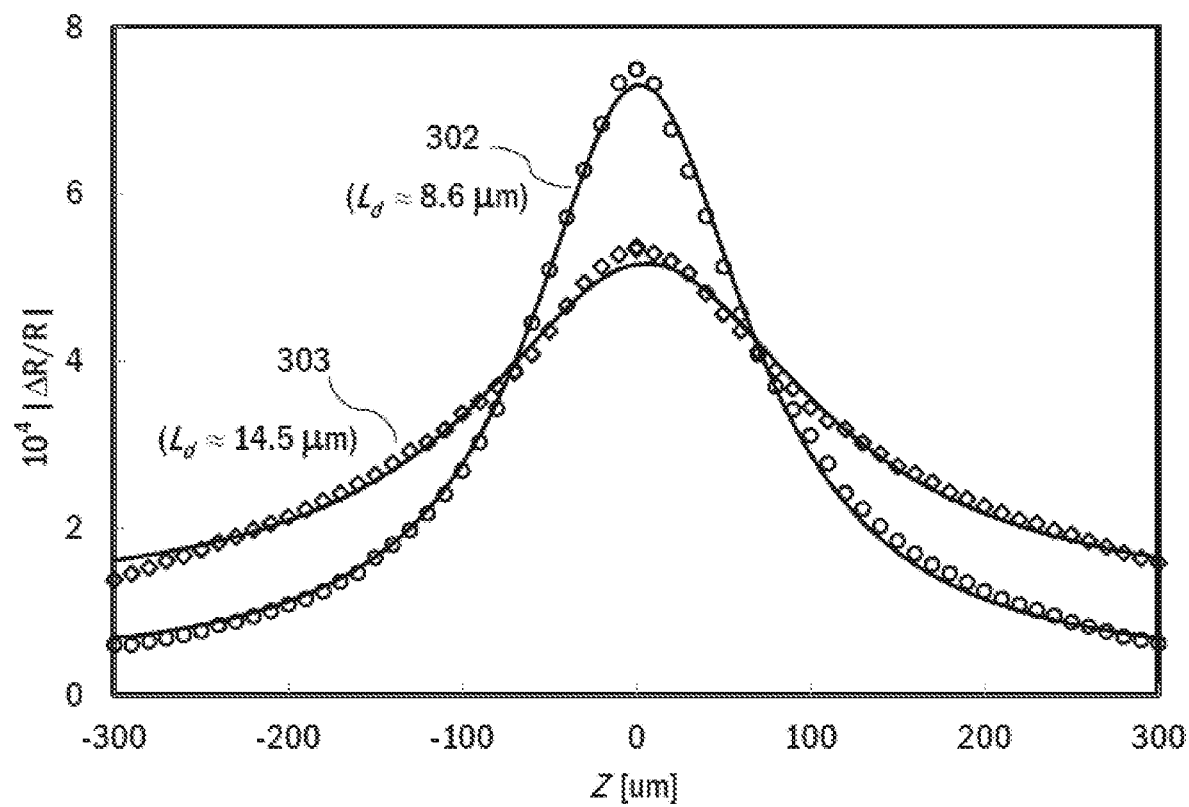
FIG. 3 shows Z-scanning laser PMR amplitude data and fits illustrating the effect of near surface damage on carrier diffusion length in shallow electrical junctions formed in silicon. The more narrow Z profile indicates a shorter diffusion length.
Figure 4:
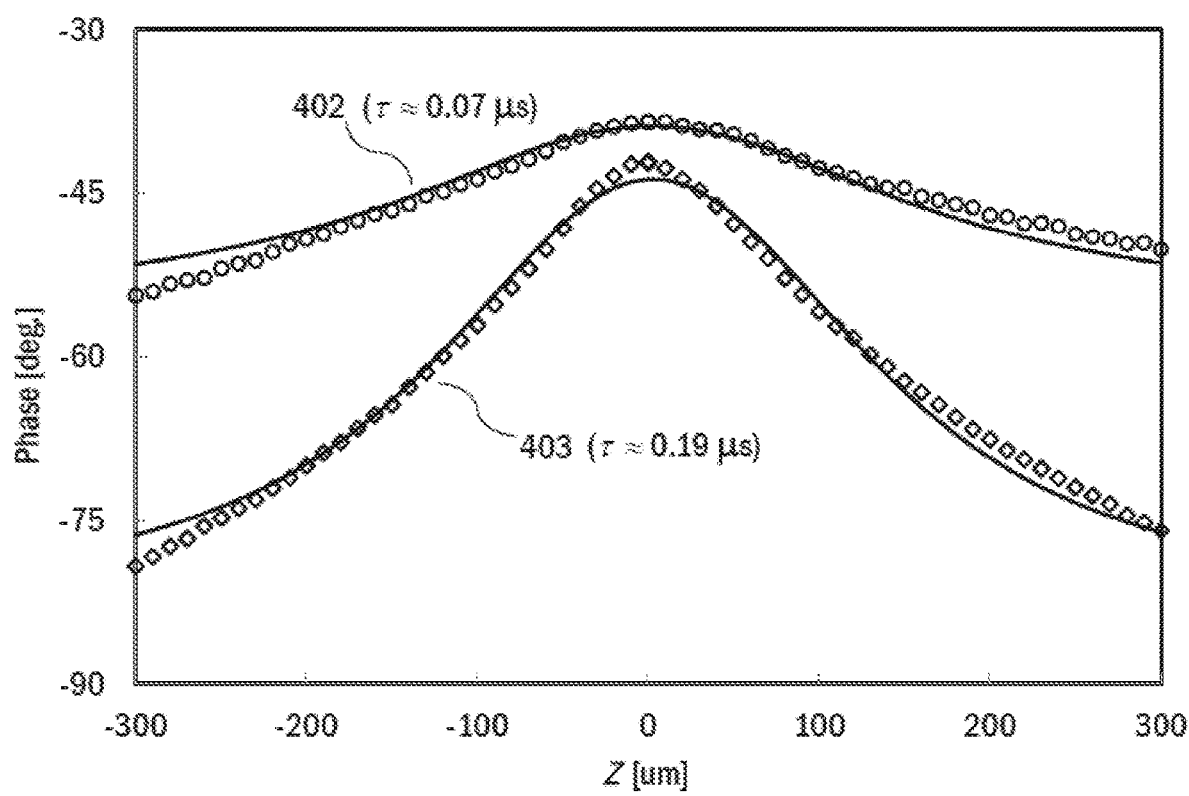
FIG. 4 shows Z-scanning laser PMR phase data and fits generated from the same pair of samples as shown in FIG. 3, illustrating the effect of near surface damage on carrier recombination lifetime in shallow junctions. The broader phase data corresponds to the more sharply peaked amplitude data, i.e. the broader phase profile indicates a shorter recombination lifetime.

Estimates for $\Omega\tau$ were obtained via regressive fitting to the acquired phase data. Then $\Omega\tau$ was fixed in regressive fits to the acquired amplitude data in order to yield $L_d^2$. The estimated uncertainties in the extracted parameters were also output from the fitting procedure. FIG. 3 shows experimental Z-scan PMR amplitude data and fits obtained from samples with and without AI (302 and 303, respectively). The amplitudes are symmetric with respect to Z, as anticipated. The PMR amplitude from the sample without AI 303 shows a relatively broad Z profile, whereas the data from the sample with AI 302 exhibits a narrower profile. The more sharply peaked PMR amplitude as a function of Z seen on the sample with AI evidences a shorter diffusion length. This behavior was apparent in the amplitude data for all samples that received the AI process, as expected. Likewise, FIG. 4 shows experimental Z-scan PMR phase data and fits obtained from the same pair of samples as shown in FIGS. 3 (402 and 403, respectively). The phases are again symmetric with respect to Z, in accord with Eq. (8). The observed phase lag of approximately 45° confirms operation in the intermediate frequency regime (see e.g., FIGS. 12-15 of U.S. Provisional Patent Application Ser. No. 62/498,685). The broader PMR phase as a function of Z seen on the sample with AI 402 evidences a shorter recombination lifetime. The more sharply peaked amplitude data 302 corresponds to the broader phase data 402, demonstrating carrier relaxation in the sample with AI happens more quickly and occurs over a shorter range than in the sample without AI. This behavior was apparent in the phase data for all samples that received the AI process, as expected. The remarkable impact of near surface damage on the Z-scan profile, as seen in FIGS. 3 and 4, demonstrates the embodiment discussed here is primarily sensitive to carrier electronic parameters within the absorption depth of the probe. (This near-surface specificity is a key advantage in semiconductor manufacturing.) The mobility and its estimated uncertainty were obtained from the extracted parameters via the Einstein relation. Table 1 lists fitted values of diffusion length, recombination time, and mobility for the subset of samples with AI, assuming a measurement uncertainty of 2 ppm for the PMR amplitude and 0.13° for the PMR phase.

TABLE 1

| Flash temp | $L_d$ [μm] | | τ [ns] | | μ [cm$^2$/V · s] | |
| --- | --- | --- | --- | --- | --- | --- |
| [° C.] | Flash only | Pre-soak | Flash only | Pre-soak | Flash only | Pre-soak |
| 1300/550 | 6.07 ± .02 | 6.01 ± .02 | 90.5 ± .5 | 87.6 ± .6 | 157 ± 2 | 159 ± 2 |
| 1300/550 (2X) | 9.09 ± .03 | 8.63 ± .02 | 83.1 ± .4 | 67.0 ± .5 | 382 ± 4 | 427 ± 5 |
| 1300/600 | 9.36 ± .08 | 9.92 ± .08 | 159.9 ± .5 | 167.3 ± .5 | 211 ± 3 | 226 ± 4 |
| 1350/600 | 10.19 ± .05 | 11.68 ± .02 | 163.0 ± .5 | 167.9 ± .5 | 245 ± 4 | 312 ± 4 |

Systematic variations in extracted parameters with process conditions are observed. The extracted carrier parameters show little sensitivity to the As thermal anneal (columns labeled "Pre-soak"). This is expected since the AI step occurred after the As thermal anneal (prior to B implantation). When the 1300° C./550° C. flash anneal is repeated, the diffusion length increases by a factor of ≈1.5×, while the recombination lifetimes are reduced by ≈10%. When the base temperature of the flash anneal is increased to 600° C., the carrier recombination lifetime roughly doubles, indicating this higher base temperature results in better removal of the AI damage. However, the observed diffusion length only increases ≈10% (with respect to the repeated 1300° C./550° C. anneal). This behavior indicates the repeated 1300° C./550° C. flash anneal achieves good junction activation but does not completely anneal the AI damage. Thus, using the Z-scan PMR technique, the effect of the process conditions on carrier transport properties are easily observed. This capability allows a semiconductor device manufacturer to tailor process conditions to achieve (and control) the desired result, and is therefore of great practical value in semiconductor manufacturing. For all samples tested, the measured mobilities comport with values expected from the activated doping levels. The estimated uncertainties in the extracted mobilities remains less than 2% in all cases.

In sum, the analytic parameterization for the Z dependence of the PMR signal in terms of carrier diffusion length enables the direct, high precision determination of carrier diffusion lengths, recombination lifetimes, and/or diffusion coefficients using a nonlinear regressive fit to data obtained from a simple optical arrangement. For example, once the diffusion length and recombination lifetime (and their estimated uncertainties) are known from the fit procedure, these carrier transport properties may be used to evaluate the diffusion coefficient, or equivalently, the carrier mobility (via the Einstein relation). Alternatively, low and high frequency PMR amplitude curves can be fit to obtain the carrier diffusion length and diffusion coefficient, respectively, which then may be used to evaluate the recombination lifetime. And once the mobility and the recombination time are known, the carrier effective mass may likewise be evaluated. In addition, the PMR amplitude at focus has been previously used to characterize active doping concentration (i.e. through the dependence of Eq. (1) on $N_e$) [Chism 2010]. Therefore, provided the active dopant concentration is determined from the PMR amplitude at focus (or otherwise), the mobility as measured from the Z-scanning PMR technique may be used to characterize the sheet resistance $R_s$ via the relation $R_s \propto 1/\mu N_e$. Thus, it is clear the PMR technique disclosed here may be of immediate practical use in semiconductor device manufacturing.

As to a further discussion of the manner of usage and operation of the present invention, the same should be apparent from the above description.

With respect to the above description then, it is to be realized that the optimum dimensional relationships for the parts of the invention, to include variations in size, materials, shape, form, function and manner of operation, assembly and use, are deemed readily apparent to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the disclosure.

The disclosures of all patents, patent applications, and publications cited herein are hereby incorporated herein by reference in their entirety, to the extent that they provide exemplary, procedural, or other details supplementary to those set forth herein.

What is claimed is:

1. A method of determining at least one electronic transport property of a semiconducting sample, the method comprising the steps of:
    (a) directing an amplitude modulated pump laser beam onto an area of a surface of the sample, wherein the pump laser beam comprises at least one wavelength with energy greater than the smallest interband transition energy of a semiconductor material within the sample, thereby inducing time periodic changes in electronic charge density within the sample such that the reflectance of the sample obtains a time periodic modulation;
    (b) directing a second probe laser beam onto an area of the surface of the sample, said area obtaining the time periodic modulated reflectance of step (a), wherein the probe laser beam comprises at least one wavelength suitable for detecting the induced changes in the reflectivity of the sample;

(c) collecting and directing the probe light reflected from the sample into a photoreceiver which produces an electrical output in response thereto, said output comprising a photo-modulated reflectance signal;

(d) measuring the photo-modulated reflectance signal using a phase-locked detection circuit;

(e) performing a series of photo-modulated reflectance measurements of steps (a), (b), (c) and (d), with the surface of the sample at a plurality of distances from the focal plane of the pump laser beam;

(f) performing a nonlinear regression analysis using the information collected in steps (a), (b), (c), (d) and (e) wherein the nonlinear regression analysis uses at least one electronic transport property of the sample as a variable parameter to determine said at least one electronic transport property of the sample; and (g) reporting at least one determined electronic transport property of the sample.

2. The method of claim 1, further comprising:
performing a second nonlinear regression analysis using the information collected in steps (a), (b), (c), (d) and (e) to determine at least one electronic transport property of the sample, wherein the second nonlinear regression analysis uses at least one electronic transport property of the sample as a variable parameter and at least one electronic transport property of the sample as determined in step (f) as a fixed value.

3. The method of claim 1, wherein an electronic transport property of the sample is selected from the group consisting of a carrier diffusion length, the square of a carrier diffusion length, a carrier recombination lifetime, the product of the modulation frequency and a carrier recombination lifetime, a carrier diffusion coefficient, a carrier mobility, a carrier effective mass, a sheet resistance, and a sheet conductance.

4. The method of claim 1, wherein the pump beam waist is selected to be within an order of magnitude of a carrier diffusion length or less.

5. The method of claim 1, wherein the modulation period is selected to be within an order of magnitude of a carrier recombination lifetime or greater.

6. The method of claim 1, wherein the nonlinear regression analysis comprises Levenberg-Marquardt minimization.

7. The method of claim 1, wherein the nonlinear regression analysis comprises a parametric model of the form:

$$|\Delta R/R|=A/[D^2+2D\{\omega^2(Z)+\omega_p^2(Z)\}+\{\omega^2(Z)+\omega_p^2(Z)\}^2(1+\Psi^2)]^{1/2}+C,$$

where $|\Delta R/R|$ represents photo-modulated reflectance amplitude data, Z is the longitudinal displacement of the sample surface from focus, $\omega(Z)$ is the probe beam radius at the sample surface, $\omega_p(Z)$ is the pump beam radius at the sample surface, A is a variable parameter which represents an amplitude, D is a variable parameter which represents the square of a carrier diffusion length, $\Psi$ is a variable parameter which represents the product of the modulation frequency and a carrier recombination lifetime, and C is a variable parameter which represents a constant.

8. The method of claim 1, wherein the nonlinear regression analysis comprises a parametric model of the form:

$$\phi=\tan^{-1}\{D\Psi/[D+\{\omega^2(Z)+\omega_p^2(Z)\}(1+\Psi^2)]\}+\pi_o,$$

where $\phi$ represents photo-modulated reflectance phase data, Z is the longitudinal displacement of the sample surface from focus, $\omega(Z)$ is the probe beam radius at the sample surface, $\omega_p(Z)$ is the pump beam radius at the sample surface, D is a variable parameter which represents the square of a carrier diffusion length, $\Psi$ is a variable parameter which represents the product of the modulation frequency and a carrier recombination lifetime, and $\phi_o$ is a variable parameter which represents a constant.

9. The method of claim 1, wherein the nonlinear regression analysis comprises a parametric model of the form:

$$|\Delta R/R|=A/[D+\omega^2(Z)+\omega_p^2(Z)]+C,$$

where $|\Delta R/R|$ represents photo-modulated reflectance amplitude data, Z is the longitudinal displacement of the sample surface from focus, $\omega(Z)$ is the probe beam radius at the sample surface, $\omega_p(Z)$ is the pump beam radius at the sample surface, A is a variable parameter which represents an amplitude, D is a variable parameter which represents the square of a carrier diffusion length, and C is a variable parameter which represents a constant.

10. The method of claim 1, wherein the nonlinear regression analysis comprises a parametric model of the form:

$$\phi=\tan^{-1}\{D\Psi/[D+\omega^2(Z)+_p^2(Z)]\}+\phi_o,$$

where $\phi$ represents photo-modulated reflectance phase data, Z is the longitudinal displacement of the sample surface from focus, $\omega(Z)$ is the probe beam radius at the sample surface, $\omega_p(Z)$ is the pump beam radius at the sample surface, D is a variable parameter which represents the square of a carrier diffusion length, $\Psi$ is a variable parameter which represents the product of the modulation frequency and a carrier recombination lifetime, and $\phi_o$ is a variable parameter which represents a constant.

11. The method of claim 1, wherein the nonlinear regression analysis comprises a parametric model of the form:

$$|\Delta R/R|=A/[(D/\Omega)^2+\{\omega^2(Z)+\omega_p^2(Z)\}^2]^{1/2}+C,$$

where $|\Delta R/R|$ represents photo-modulated reflectance amplitude data, Z is the longitudinal displacement of the sample surface from focus, $\omega(Z)$ is the probe beam radius at the sample surface, $\omega_p(Z)$ is the pump beam radius at the sample surface, $\Omega$ is the modulation frequency, A is a variable parameter which represents an amplitude, D is a variable parameter which represents a carrier diffusion coefficient, and C is a variable parameter which represents a constant.

12. The method of claim 1, wherein the nonlinear regression analysis comprises a parametric model of the form:

$$\phi=\tan^{-1}\{(D/\Omega)/[\omega^2(Z)+\omega_p^2(Z)]\}+\phi_o,$$

where $\phi$ represents photo-modulated reflectance phase data, Z is the longitudinal displacement of the sample surface from focus, $\omega(Z)$ is the probe beam radius at the sample surface, $\omega_p(Z)$ is the pump beam radius at the sample surface, $\Omega$ is the modulation frequency, D is a variable parameter which represents a carrier diffusion coefficient, and $\phi_o$ is a variable parameter which represents a constant.

13. An apparatus for determining at least one electronic transport property of a semiconducting sample, the apparatus comprising the means for:

(a) directing an amplitude modulated pump laser beam onto an area of a surface of the sample, wherein the pump laser beam comprises at least one wavelength with energy greater than the smallest interband transition energy of a semiconductor material within the sample;

(b) directing a second probe laser beam onto an area common with the area of step (a), wherein the probe laser beam comprises at least one wavelength suitable for detecting the induced changes in the reflectivity of the sample;

(c) collecting and directing the probe light reflected from the sample into a photoreceiver which produces an electrical output in response thereto, said output comprising a photo-modulated reflectance signal;

(d) measuring the photo-modulated reflectance signal using a phase-locked detection circuit;

(e) performing a series of photo-modulated reflectance measurements of steps (a), (b), (c), and (d), with the surface of sample at a plurality of distances from the focal plane of the pump laser beam;

(f) performing a nonlinear regression analysis using the information collected in steps (a), (b), (c), (d), and (e) wherein the nonlinear regression analysis uses at least one electronic transport property of the sample as a variable parameter to determine said at least one electronic transport property of the sample; and (g) reporting at least one determined electronic transport property of the sample.

14. An apparatus for determining at least one electronic transport property of a semiconducting sample, the apparatus comprising:

(a) a first laser source producing an amplitude modulated pump laser beam, wherein the pump laser beam comprises at least one wavelength suitable for inducing time periodic changes in electronic charge density within the sample;

(b) a second laser source producing a continuous wave probe laser beam, wherein the probe laser beam comprises at least one wavelength suitable for detecting time periodic changes in the reflectivity of the sample induced by the amplitude modulated pump laser beam;

(c) an optical system effective to direct either laser beam onto a common area on a sample surface, to translate the focal plane of the amplitude modulated pump laser beam with respect to the sample surface, and to collect and direct probe light reflected from the sample into a photoreceiver;

(d) a photoreceiver effective to generate an electrical output in response to changes in the reflected probe light amplitude;

(e) a phase-locked detection circuit effective to measure the electrical output of step (d);

(f) a computer/controller effective to record a series of photo-modulated reflectance measurements as a function of the distance between the sample surface and the focal plane of the amplitude modulated pump laser beam; and (g) a computer program, embodied on a non-transitory computer readable medium, comprising executable code to perform a nonlinear regression analysis using at least a recorded information to determine at least one electronic transport property of the sample and to report at least one determined electronic transport property of the sample.

15. The apparatus of claim 14, wherein the amplitude modulated pump laser beam is directed onto the sample at normal incidence.

16. The apparatus of claim 14, wherein the continuous wave probe laser beam is collinear with the amplitude modulated pump laser beam.

17. The apparatus of claim 14, wherein the continuous wave probe laser beam is directed onto the sample at an oblique angle of incidence.

18. The apparatus of claim 14, wherein the photoreceiver comprises an avalanche photodiode connected to an amplifier circuit.

19. The apparatus of claim 14, wherein the phase-locked detection circuit comprises a wide bandwidth lock-in amplifier.

20. The apparatus of claim 14, wherein the computer/controller is effective to control the focal position of the pump beam with respect to the sample surface.

* * * * *